(12) United States Patent
Bulja et al.

(10) Patent No.: US 11,594,795 B2
(45) Date of Patent: Feb. 28, 2023

(54) SWITCHABLE ELEMENT

(71) Applicant: Nokia Solutions and Networks Oy, Espoo (FI)

(72) Inventors: Senad Bulja, Dublin (IE); Wolfgang Templ, Sersheim (DE); Florian Pivit, Dublin (IE); Dirk Wiegner, Schwaikheim (DE); Anna Zakrzewska, Dublin (IE); Pawel Rulikowski, Clonsilla (IE); Rose Kopf, Green Brook, NJ (US)

(73) Assignee: Nokia Solutions and Networks Oy, Espoo (FI)

( * ) Notice: Subject to any disclaimer, the term of this patent is extended or adjusted under 35 U.S.C. 154(b) by 363 days.

(21) Appl. No.: 17/005,652

(22) Filed: Aug. 28, 2020

(65) Prior Publication Data
US 2021/0063833 A1 Mar. 4, 2021

(30) Foreign Application Priority Data
Aug. 30, 2019 (EP) .................................. 19194709

(51) Int. Cl.
| | |
|---|---|
| *H01P 1/10* | (2006.01) |
| *H01P 1/18* | (2006.01) |
| *H03B 5/12* | (2006.01) |
| *H01Q 15/00* | (2006.01) |
| *H01P 1/11* | (2006.01) |

(52) U.S. Cl.
CPC .................. *H01P 1/10* (2013.01); *H01P 1/11* (2013.01); *H01P 1/181* (2013.01); *H01Q 15/002* (2013.01); *H03B 5/1293* (2013.01); *C09K 2219/11* (2013.01)

(58) Field of Classification Search
CPC ... H01P 1/10; H01P 1/11; H01P 1/112; H01Q 15/002; H01Q 15/0013; H03B 5/1293
See application file for complete search history.

(56) References Cited

U.S. PATENT DOCUMENTS

| | | | | |
|---|---|---|---|---|
| 8,030,637 | B2 * | 10/2011 | Ufert ..................... | H01L 27/101 257/E51.025 |
| 9,641,181 | B2 | 5/2017 | Bramanti | |
| 11,239,549 | B2 * | 2/2022 | Nomura ............... | H01Q 1/2283 |
| 2004/0028838 | A1 | 2/2004 | Chang et al. | |

(Continued)

OTHER PUBLICATIONS

Shabanpour; "Programmable anisotropic digital metasurface for independent manipulation of dual-polarized THz waves based on a voltage-controlled phase transition of VO2 microwires"; Journal of Materials Chemistry C; vol. 8, No. 21; Royal Society of Chemistry; Apr. 15, 2020; 11 pgs.

(Continued)

*Primary Examiner* — Hai L Nguyen

(57) ABSTRACT

A switchable element, a device and a method for analogue and programmable computing operating on electromagnetic waves having a frequency, wherein the switchable element is configured to configured to, in response to an activation signal, switch from having a first dielectric permittivity for electromagnetic waves having a frequency to having a second dielectric permittivity for electromagnetic waves having the frequency, and the device comprises a plurality of the switchable elements that are adapted to be switched individually in accordance with the computing operation.

18 Claims, 11 Drawing Sheets

(56) References Cited

U.S. PATENT DOCUMENTS

2006/0152304 A1     7/2006    Liang et al.
2010/0165431 A1     7/2010    Li et al.
2013/0320501 A1     5/2013    Zhang et al.

OTHER PUBLICATIONS

Middleton; "A metamaterial solves an integral equation"; Physics Today; vol. 72, No. 6; https://physicstoday.scitation.org/doi/full/10.1063/PT.3.4222; Jun. 1, 2019; 6 pgs.

Chizari, et al.; "Analog optical computing based on a dielectric meta-reflect array"; Optical Society of America; Optics Letters; vol. 41, No. 15; Aug. 1, 2016; 4 pgs.

Aron; "First light-bending calculator designed with metamaterials"; New Scientist; SOI: 10.1126/science.1242818; Jan. 9, 2014; 3 pgs.

"Metamaterial computer solves integralequations encoded in electromagnetic waves"; Physics World; https://physicsworld.com/a/metamaterial-computer-solves-integral-equations-encoded-in-electomagnetcs-waves/; Mar. 22, 2019; 2 pgs.

Li, et al.; "Electromagnetic reprogrammable coding-metasurface holograms"; Nature Communications; DOI.10.1038/s41467-017-00164-9; www.nature.com/naturecommunications; Dec. 5, 2016; 7 pgs.

Silva, et al.; "Performing Mathematical Operations with Metamaterials"; Science, vol. 343; www.sciencemag.org; Jan. 10, 2014; 5 pgs.

Hinkle, et al.; "Enhanced tunneling in stacked gate dielectrics with ultra-thin HfO2 (ZrO2) layers snadwiched between thicker SiO2 layers"; Elsevier; Science Direct; www.elsevier.com/locate/susc; www.sciencedirect.com; Jun. 17, 2014; 5 pgs.

Im, et al.; "Layered (BaxSr1-x)Ti1+yO3+z thin films for high frequency turnable devices"; ScienceDirect; vol. 413, Issues 1-2; https://doi.org/10.1016/S0040-6090(02)00348-6; Jun. 24, 2002; 2 pgs.

\* cited by examiner

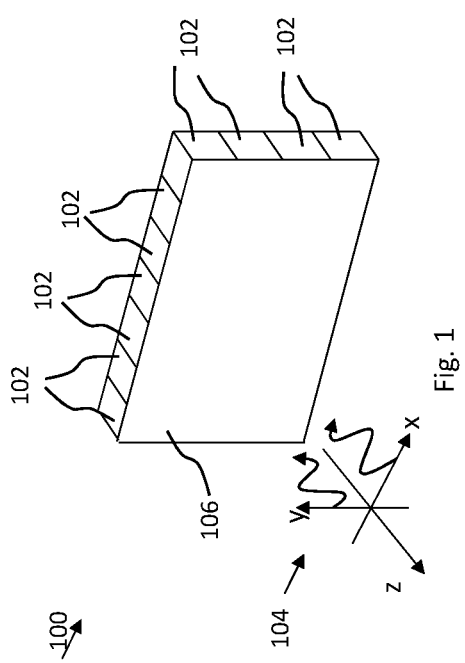

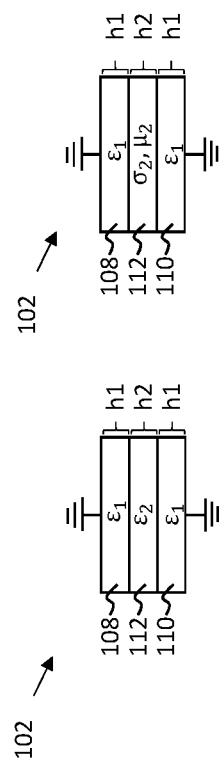

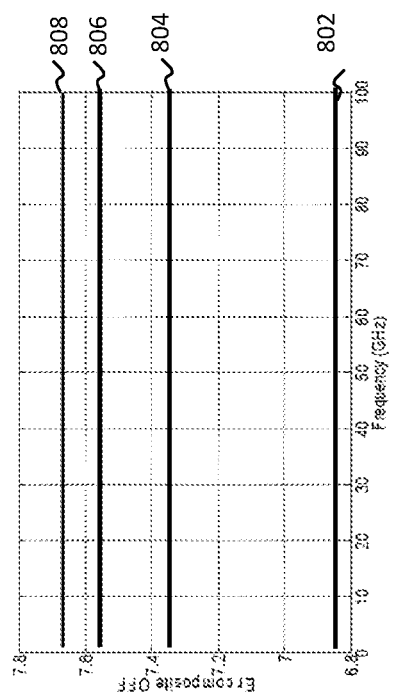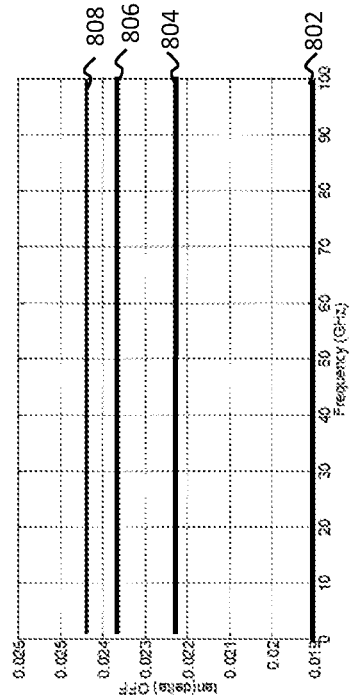
Fig. 8a

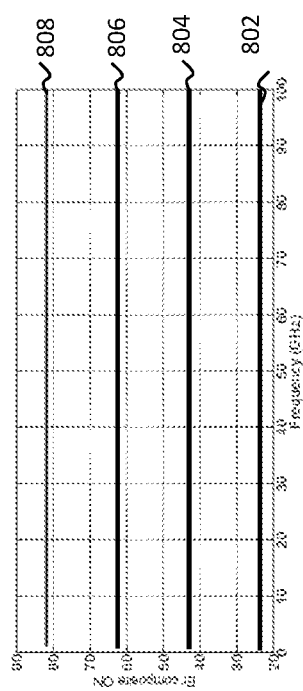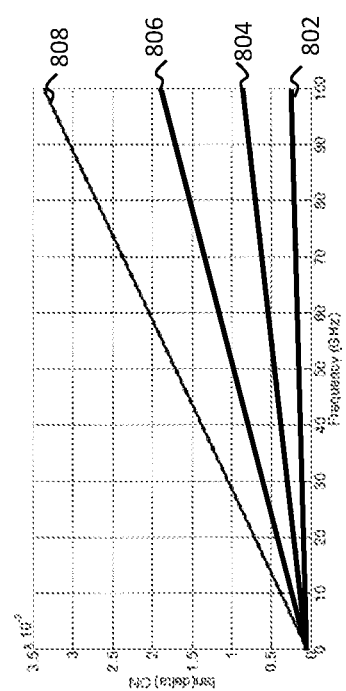
Fig. 8b

SWITCHABLE ELEMENT

CROSS-REFERENCE TO RELATED APPLICATION

This application claims the benefit of EP Application Serial No. 19194709.2, filed by Senad Bulja, et al. on Aug. 30, 2019, entitled "A SWITCHABLE ELEMENT," commonly assigned with this application and incorporated herein by reference in its entirety.

FIELD OF THE DISCLOSURE

The disclosure relates to devices and methods for performing switching operation.

BACKGROUND

Some switchable devices are used for example for performing computing operations which use a fixed metamaterial structure comprising a surface to perform a mathematical operation on an input signal that is reflected to create a modified output signal. Other devices apply quantum phenomena for performing mathematical operations.

SUMMARY

According to the following disclosure, a switchable element is provided that is configured to, in response to an activation signal, switch from having a first dielectric permittivity for electromagnetic waves having a frequency to having a second dielectric permittivity for electromagnetic waves having the frequency. This provides a programmable analogue computing element producing the result of the computation in an output signal by changing an electromagnetic wave of an input signal while the signal is propagating through the nonreflecting switchable element.

In one aspect, the switchable element comprises a first layer of dielectric material and a second layer of dielectric material and a switching layer between the first layer and the second layer, wherein the switching layer is configured to switch between a non-conductive state and a conductive state.

In another aspect, one state of the conductive state and the non-conductive state is associated with a first value of a binary bit and the other state of the conductive state and the non-conductive state is associated with a second value of the binary bit, different from the first value.

In another aspect, the switchable element comprises a liquid crystal layer or a ferroelectrics layer having a variable dielectric permittivity birefringence which is tunable by a tuning voltage.

In another aspect, the switchable element comprises an electro-chromic layer having a variable dielectric permittivity which is tunable by a tuning voltage in the range.

According to the following disclosure a device for analogue and programmable computing operating on electromagnetic waves having a frequency, comprises a plurality of switchable element according to any one of the preceding claims that are adapted to be switched individually in accordance with the computing operation.

The switchable element may comprise a switchable layer and at least one layer of dielectric material, wherein the switchable element is configured to having a first dielectric permittivity in a conductive state of the switchable layer) and to having a second dielectric permittivity in a non-conductive state of the switchable layer, wherein the switchable element comprises at least one contact configured to having contact with the switchable layer.

The at least one layer of dielectric material may be configured with a via, wherein the at least one contact is disposed in the via.

A first contact may be disposed on a first side of the switchable layer, wherein a second contact is disposed on a second side of the switchable layer.

The first contact may be disposed at a distance from the second contact.

A patch may be disposed on the at least one layer of dielectric material, wherein the patch is configured to contact the first contact.

The switching layer may be configured to switch between a non-conductive state and a conductive state.

The switchable element may comprise a transition metal oxide.

The transition metal oxide may be an oxide of one of titanium, vanadium, chromium, mangan, iron, cobalt, nickel, niobium, molibdenium, rhuthenium, tantalum, tungsten and iridium.

The switchable element may comprise a plurality of the switchable layers and/or a plurality of the layers of dielectric material.

The at least one contact may be configured to having contact with the plurality of switchable layers.

The plurality of the layers of dielectric material may be configured with at least one via, wherein the at least one contact is disposed in the at least one via.

The switchable element may comprise a first contact configured to having contact with the plurality of switchable layers.

At least on switchable layer and at least one layer of dielectric material may be alternately stacked.

A plurality of switchable layers may have the essentially same composition and/or the same height as compared to another layer or wherein a plurality of layers of dielectric material may have the essentially same composition and/or the same height as compared to another layer of dielectric material.

At least one switchable layer may have a different composition and/or height than another switchable layer or wherein at least one layer of dielectric material has a different composition and/or height than another layer of dielectric material.

The at least one contact may be configured to apply a tuning voltage or a tuning temperature to at least one switchable layer.

Some embodiments of the switchable elements may be used in computing operation.

Preferably, a computing layer comprises the plurality of the switchable elements arranged in a plane array.

A plurality of the computing layers may be stacked in a direction perpendicular to the plane.

A plurality of layers in the switchable element may have the same composition and/or the same height.

At least on layer of at least two different individual switchable elements may have different composition and/or height as compared to another layer in another switchable element.

According to the following disclosure, a method of manufacturing a device for analogue and programmable computing operating on electromagnetic waves having a frequency, wherein a switchable element is switched from having a first dielectric permittivity for electromagnetic waves having the frequency to a second dielectric permittivity for electromagnetic waves having the frequency, and wherein the method comprises switching a plurality of the switchable elements individually in accordance with the computing operation.

In one aspect, the switchable element is provided with a first layer of dielectric material and a second layer of dielectric material and a switching layer between the first layer and the second layer, wherein the method further comprises switching between a non-conductive state and a conductive state of the switching layer.

In another aspect, switching between the conductive state and the non-conductive state represents switching between a first value of a binary bit and a second value of the binary bit, different from the first value.

In another aspect, the switchable element is provided with a liquid crystal layer or a ferroelectrics layer having a variable dielectric permittivity birefringence, wherein the method further comprises tuning the dielectric permittivity birefringence by a tuning voltage.

In another aspect, the switchable element is provided with an electro-chromic layer having a variable dielectric permittivity, wherein the method further comprises tuning the dielectric permittivity by a tuning voltage.

BRIEF DESCRIPTION OF THE FIGURES

Further features, aspects and advantages of examples of the illustrative embodiments are explained in the following detailed description with reference to the drawings in which:

FIG. 1 schematically depicts first aspects of an exemplary device for analogue and programmable computing operating on electromagnetic waves.

DETAILED DESCRIPTION OF ILLUSTRATIVE EMBODIMENTS

Figure 2D:
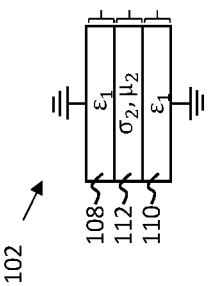
FIG. 2a-2d depict aspects of an exemplary individual switchable element.

Digital computation has been in widespread use ever since the invention of the transistor. Algebra is used to describe phenomena by an equation. Often a solution to an equation is not tractable by a direct analytic approach. To circumvent the above difficulty complex problems occurring in nature are often epitomized using sets of equations, e.g. differential, integral or transcendent equations. Solutions are solvable by domain discretization—rather than solving the equation itself. This means, the equation to be solved is represented by a set of simplified equations over a specific region. This set of equations is easily representable in the digitalized fashion, where the solution can be found using transistor logic. Depending on the granularity of the solution, i.e. the desired accuracy over a specified region, the solution to a specified equation can require a large amount of transistors. Hence, better accuracies are possible using more transistors, which, to avoid large sizes, may need to be packed in a smaller area. At some point, the size of the transistor will become comparable to the critical dimensions of atoms, which imposes hard limits.

In the case of Electro-Magnetics (EM), equations are either the consequence of current distribution on conductive surfaces or EM fields propagating/non-propagating in media. Nature itself is analogue at our macro level hence analogue computation is typically more energy efficient than its digital counterpart. From this point of view digital computing is rather inefficient—it relies on the conversion of the problem from its natural domain, in the present example EM, to a set of discretized equations to be solved and the subsequent up-conversion of the solution so that it is representable in the way the user desires.

In the following, an equivalent of an analogue computer is disclosed, capable of performing a variety of mathematical operations, i.e. solving equations, in the inherent, natural domain from which these equations arose. In an example, a case of wireless signals is described.

FIG. 1 depicts an example of a device 100 for analogue and programmable computing operating on electromagnetic waves having a frequency. The electromagnetic waves are in the example in the range of radio frequency waves having a frequency above 9 Kilohertz, in particular mm-waves having a frequency range between 30 Gigahertz to 300 Gigahertz. The frequency range may be a THz frequency range as well. In general, the device may be adapted to operate on other electromagnetic waves as well.

According to a first aspect, the device 100 comprises a plurality of switchable elements 102 that are adapted to be switched individually in accordance with the computing operation. In general, the switchable elements 102 are adapted to be switched in response to an activation signal.

A plurality of switchable elements 102 of the plurality of switchable elements is configured to be switched from having a first dielectric permittivity for electromagnetic waves having the frequency to having a second dielectric permittivity for electromagnetic waves having the frequency.

In FIG. 1, a Cartesian coordinate system is depicted. A plane electromagnetic wave 104 propagating in a negative z-axis direction is linearly polarized along an x-axis and a y-axis. The electromagnetic wave 104 is propagating in the negative z-axis direction and impinges on a surface 106 of the device 100. The surface 106 is considered as a metasurface having a predetermined size.

Figure 2C:
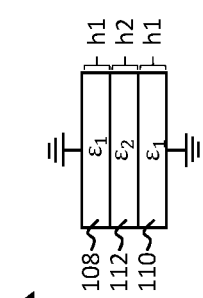
Figure 2B:
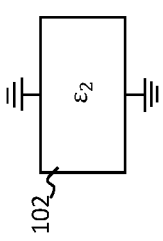
Figure 2A:
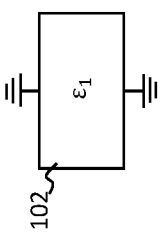

FIG. 2a depicts an exemplary individual switchable element 102 having a first dielectric permittivity $\varepsilon_1$ in a non-actuated state. FIG. 2b depicts the exemplary individual switchable element 102 having a second dielectric permittivity $\varepsilon_2$ in an actuated state. The switchable element 102 is configured to, in response to the activation signal, switch from having the first dielectric permittivity $\varepsilon_1$ for electromagnetic waves having the frequency to having the second dielectric permittivity $\varepsilon_2$ for electromagnetic waves having the frequency. This individual switchable element 102 defines a basic generic unit cell that can be implemented using liquid crystals, ferroelectrics or other bulk tuneable media.

FIG. 2c depicts another exemplary individual switchable element 102 in a non-actuated state. FIG. 2d depicts the exemplary individual switchable element 102 in an actuated state.

The individual switchable element 102 comprises a first layer 108 of dielectric material and a second layer 110 of dielectric material. The activation signal may be a voltage that is applied between the first layer 108 and the second layer 110.

A switching layer 112 may be disposed between the first layer 108 and the second layer 110. The first layer 108 and of the second layer 110 in this example have the same dielectric permittivity $\varepsilon_1$.

In one aspect, the switching layer 112 is configured to switch between a non-conductive state and a conductive state in response to the activation signal. For example, the switching layer 112 comprises metal oxides. Then the dielectric characteristics of the transition metal oxides change by a Mott transition, i.e. a transition from dielectrics to conductors.

The switching layer 112 has dielectric permittivity $\varepsilon_2$ in the non-conductive state. In the conductive state, the dielectric permittivity depends on the electrical conductivity $\sigma_2$ and the permeability $\mu_2$ of the material or composition in the switching layer 112.

The dielectric permittivity $\varepsilon_1$ is the same in both states, the non-conductive state and the conductive state.

The equivalent dielectric permittivity of a switchable element 102 having these 3 layers is defined for the non-conductive state as $$\varepsilon_{off} = \frac{2h_1 + h_2}{\frac{2h_1}{\varepsilon_{r1}} + \frac{h_2}{\varepsilon_{r2}}}$$

Where $h_1$ represents the height of a plurality of the first and the second dielectric layers and $h_2$ represents the height of the switchable element's layer, and for the conductive state as $$\varepsilon_{on} = \varepsilon_1 \left[1 - \frac{\gamma_m}{h_1 \varepsilon_{r2} k_0^2} \tanh(\gamma_m h_2)\right]$$

where $\varepsilon_{r1} = \varepsilon_1$ for non-conducting dielectric material and $$\varepsilon_{r2} = 1 - j\frac{\sigma_2}{\omega \varepsilon_0}$$

wherein $\varepsilon_0$ denotes the dielectric permittivity of vacuum and $$k_0 = \frac{\omega}{c}$$

is the propagation constant of electromagnetic waves in free space. $\gamma_m$ denotes the propagation constant in metals.

In general an equivalent dielectric permittivity of a switchable element 102 having n layers is defined for the non-conductive state as $$\varepsilon_{off} = \frac{\sum_{i=1}^{n} h_i}{\sum_{i=1}^{n} \frac{h_i}{\varepsilon_{ri}}}$$

For the conductive state, the equivalent dielectric permittivity depends on the dielectric material and the layers.

Figure 3:
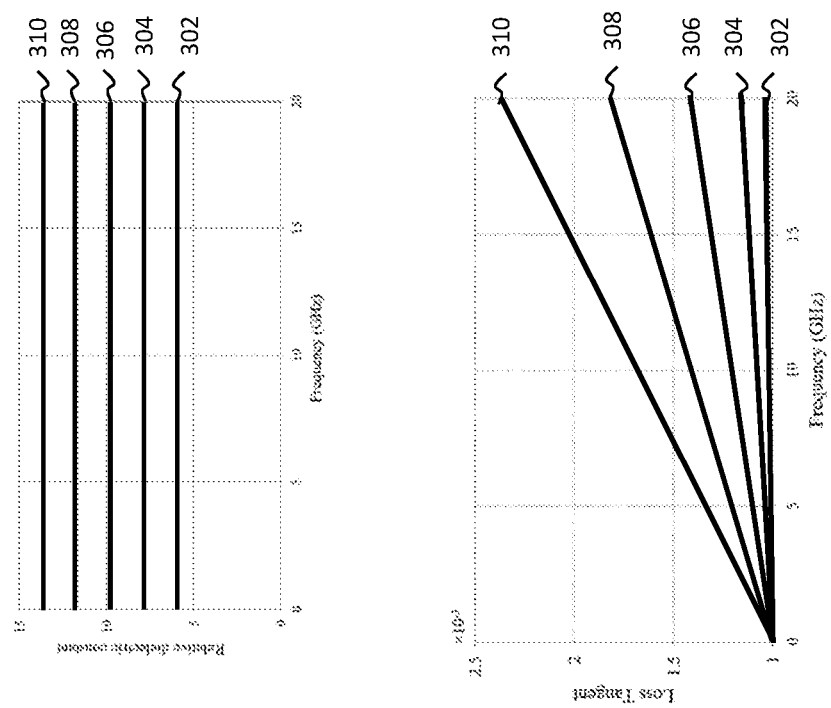
FIG. 3 depicts some properties of a three layer composite material, FIG. 4 schematically depicts further aspects of an exemplary computing layer for the device, FIG. 5 schematically depicts aspects stacked computing layers for the device, FIG. 6 schematically depicts aspects of a method of operating the device, FIG. 7a a switchable element in a non-actuated state, FIG. 7b a switchable element in an actuated state FIGS. 8a, 8b effective dielectric characteristics, FIG. 9 schematically depicts a biasing scheme, FIG. 10 a scenario for interlacing.

As an example for the possibility to tune the dielectric characteristics using sub-skin depth conductors, FIG. 3 demonstrates the obtainable effective dielectric characteristics. In FIG. 3, a dielectric constant is depicted in the upper diagram and a loss tangent of a three layer composite material is depicted in the lower diagram.

The first layer 108 and second layer 110 comprise for example silicon dioxide in particular with a permittivity of 3.9 and a thickness of 10 nm.

For the case when the dielectric material is silicon dioxide with a thickness of 10 nm the dielectric permittivity is $\varepsilon_{SiO_2} = 3.9$ and the tan $h(\delta_{SiO_2}) = 0.001$. FIG. 3 depicts various configurations when the dielectric material is silicon dioxide and the switching layer 112 comprises a conductor layer, i.e. a copper layer. The copper layer thickness is varied from 10 nm to 50 nm as depicted with the following references in FIG. 3:

302: Copper layers 10 nm,
304: Copper layers 20 nm,
306: Copper layers 30 nm,
308: Copper layers 40 nm,
310: Copper layers 50 nm.

The thickness of the copper layer is for example between 10 nm and 50 nm, in particular 10 nm, 20 nm, 30 nm, 40 nm or 50 nm.

This switching layer 112 is a conductor made to switch between the non-conductive state and conductive state thus forming a bi-stable dielectric that is controllable to change the dielectric state upon external actuation.

Another example of a material that exhibit a transition between the non-conductive to conductive state is vanadium dioxide. The switchable element 102 may comprise vanadium dioxide thus forming a bi-stable dielectric made to switch between the non-conductive state and conductive state and under the influence of an external field.

In general, the switching layer 112 may comprise an electrically conductive or semi-conductive material arranged between the first layer 108 and the second layer 110 being tunable by a tuning voltage.

The choice of the active material for the switching between the two dielectric states is dependent on the amount of flexibility needed and the granularity of the dielectric permittivity function. To this end, one may use bulk tuneable switches and discrete switches such as MEMS, cold FETs etc. For example, bulk-tuneable switches may be made from transition metal oxides, such as vanadium oxide).

A layer thickness of the conductor layer is for example less than the skin depth for the electromagnetic waves having the frequency.

In another aspect, the switchable element 102 comprises a liquid crystal layer or a ferroelectrics layer having a dielectric permittivity birefringence in a range and being tunable by a tuning voltage in the range.

The dielectric permittivity birefringence is for example quantified by the difference between the refraction index for the ordinary ray for the electromagnetic wave and the refraction index for the extraordinary ray for the electromagnetic wave. The ordinary ray and the extraordinary ray form the electromagnetic wave and propagate in the same direction. The extraordinary ray has a polarization perpendicular to that of the ordinary ray. Due to the different polarization directions, the ordinary ray and the extraordinary ray are governed by a different, direction-dependent refractive index.

The dielectric permittivity birefringence is for example tunable in the range of about 20% to about 30% for the liquid crystal layer and about 10% to 90% for the ferroelectrics layer.

The tuning voltage for the liquid crystal layer is, for example, less than 10 Volts. The tuning voltage for the ferroelectrics layer is, for example, about 100 Volts.

In another aspect, the switchable element 102 comprises an electro-chromic layer having a dielectric permittivity in a range and being tunable by a tuning voltage in the range.

The dielectric permittivity of the electro-chromic layer is for example tunable in the range of about 20% to about 80% with respect to the permittivity of vacuum. The tuning voltage for the liquid crystal is less than 20 Volts.

Herein, the term "computing" when used in conjunction with a physical entity, e.g. layer or device, is to be understood as an adjective that further defines the physical entity (and not as representing the action of computing). Therefore, for example, the term "computing layer" is to be understood to refer to a layer that is capable of computing without necessarily perfuming the action of computing at all times.

Figure 4:
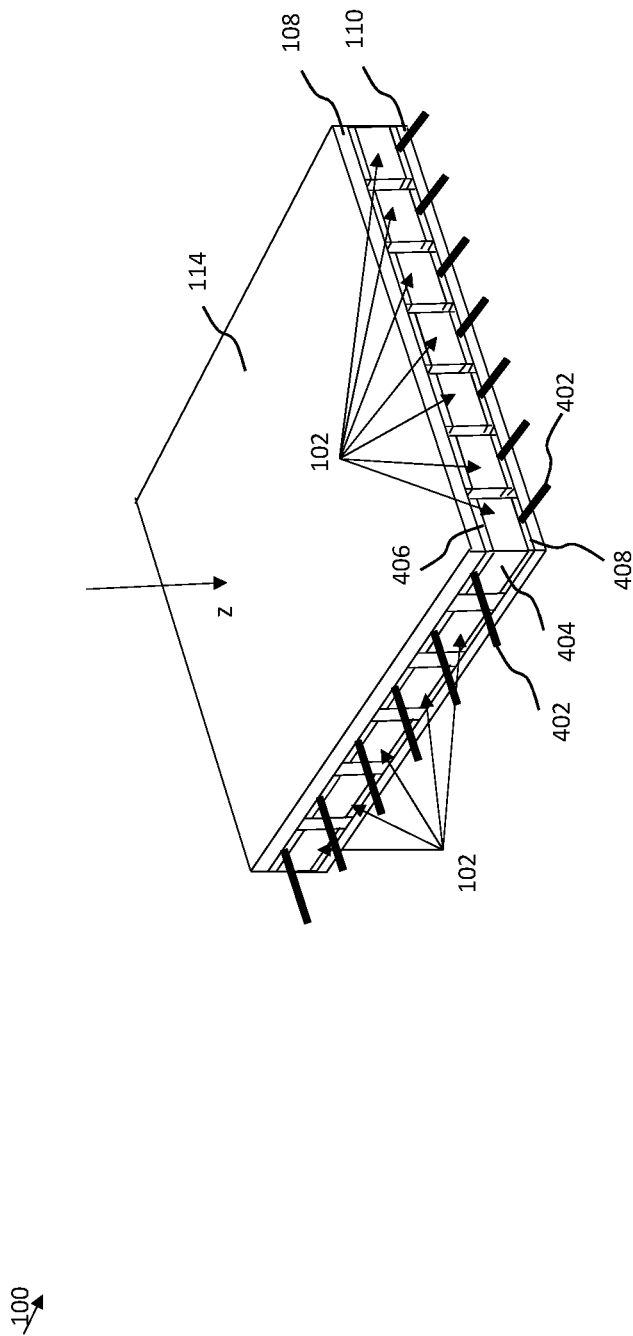

Aspects of a computing layer 114 that may be formed using the plurality of switchable elements 102 are depicted in FIG. 4. The computing layer 114 may comprise the plurality of the switchable elements 102 arranged in a plane array. A switchable element 102 forms a unit cell that is individually configurable. The unit cells are identical in the example depicted in FIG. 4. The unit cells are configurable via individual biasing lines formed by thin conductors.

The structure of the unit cells is described below for an exemplary unit cell. The unit cell is connectable to a voltage source by individual biasing lines 402. The switching layer 112 in on aspect may be a conductor. Depicted in FIG. 4 is an aspect where the switchable elements 102 include active material 404 made e.g. of one of the aforementioned materials. The switching layer 112 of a plurality of the individual switchable elements 102 is disposed between a separate first biasing patch 406 and a second biasing patch 408 connected to two separate biasing lines 402. Thus, a plurality of the switchable elements 102 is individually switchable by tuning the voltage in the aforementioned range between the patches.

This allows a computing operation as a function of the profile of the dielectric permittivity of the metasurface provided by the plane array. This allows controlling the shape of an output signal, i.e. an electromagnetic wave having propagated through the plane array without reflection, in accordance with the computing operation by controlling the profile of the dielectric permittivity of the metasurface 404.

In one aspect, the computing layer 114 is arranged for computing a mathematical operation by determining a state space representation, in particular a Fourier transform, of the mathematical operation. Individual states of the state space representation define the dielectric permittivity of individual switchable elements 102 in the plane array. This forms a computing layer with a 1-bit resolution in a direction perpendicular to the plane, i.e. the z-axis direction. A single plane array in the examples comprises 6×7 switchable elements 102. The plane array may comprise different amounts of switchable elements 102, e.g. N×N or N×M switchable elements 102, where N and M are integers.

The plane electromagnetic wave 104 is considered in the following as an input signal denoted with f(x,y).

For an elliptically polarized wave, the input signal can be decomposed into two orthogonal components $$f(x,y) = f_1(x) + f_2(y)$$

An output signal that emerges at the output of the plane array, can be represented in the Fourier domain $$\tilde{g}(x,y) = \tilde{G}(x,y)\tilde{f}_1(x) + \tilde{G}(x,y)\tilde{f}_2(y)$$

in state space, where $\tilde{G}(x, y)$ is the Fourier equivalent of the spatial impulse response of the plane array.

Therefore, by controlling $\tilde{G}(x, y)$ an input signal may be manipulated in a computing operation in accordance with a predefined mathematical function to form the output signal as a result of the computing operation.

In this case, $\tilde{G}(x, y)$ is a function of the profile of the dielectric permittivity of the plane array. This allows controlling the shape of the output signal in accordance with pre-described mathematical functions by controlling the profile of the dielectric permittivity of the plane array.

Figure 5:
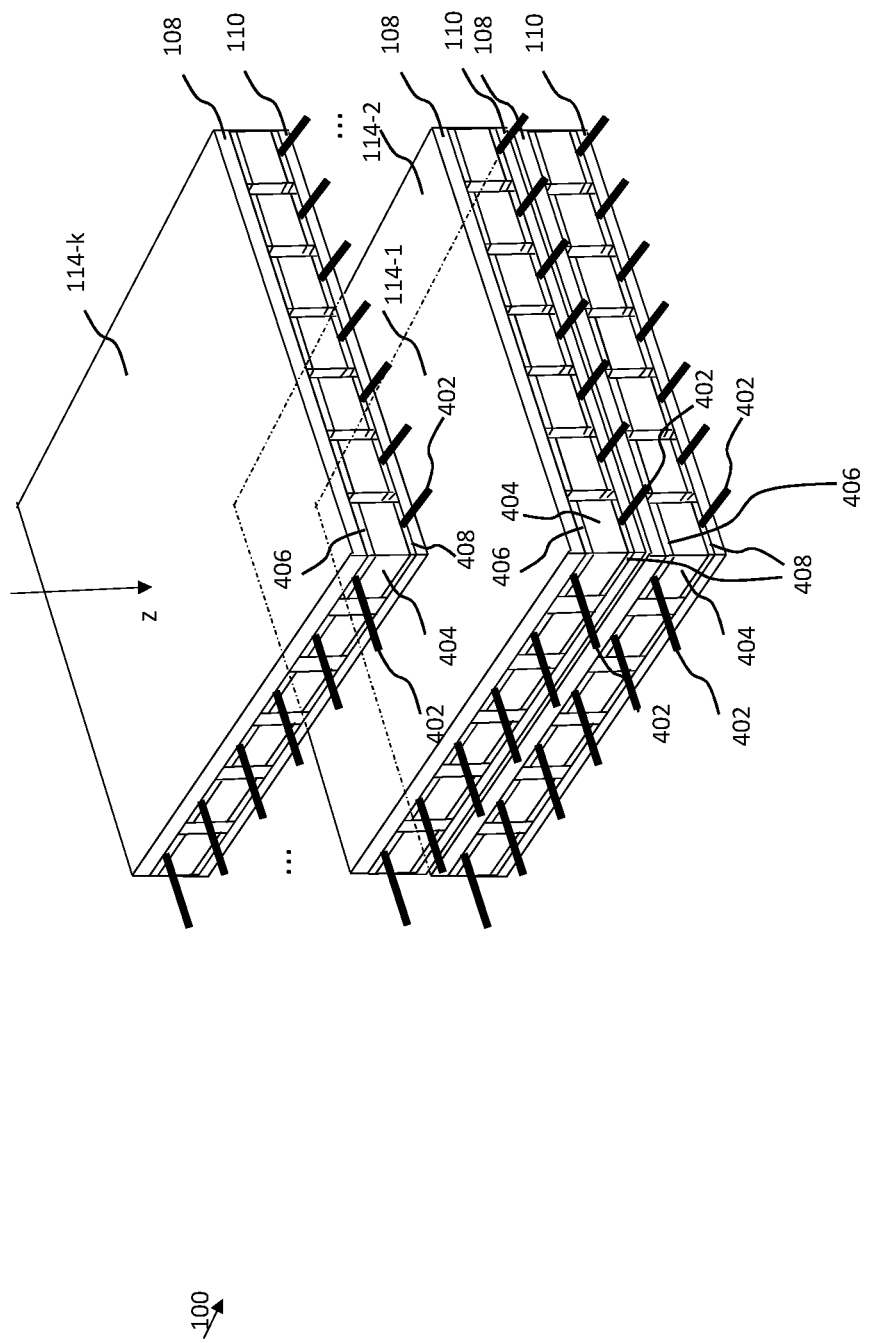

In another aspect, as depicted in FIG. 5, a plurality of the computing layers 114-1, 114-2, . . . , 114-k are stacked in a direction perpendicular to the plane. Elements in FIG. 5 that have the same function as elements described with reference to FIG. 4 have the same reference signs in both figures and are not described again. According to this aspect, the plurality of computing layers 114-1, 114-2, . . . , 114-k form a computer with an k-bit resolution corresponding to the number k of stacked layers in the direction perpendicular to the stacked plane arrays. For a case of k=2, two computing layers 114, two consecutive switchable elements 102 in z-direction represent two unit cells that provide a two bit resolution.

In this case, the dielectric permittivity of the two unit cells connected in series, e.g. unit cell 1 and unit cell 2, can be written as:

$$\varepsilon_{\mathit{reff\_composite}} = \frac{h_1 + h_2}{\frac{h_1}{\overline{\varepsilon_1}} + \frac{h_2}{\overline{\varepsilon_2}}}$$

Depending on the state of dielectrics $\overline{\varepsilon_1}$ and $\overline{\varepsilon_2}$, the composite dielectric permittivity can attain four values, $$\varepsilon_{\mathit{reff\_composite\_1}} = \frac{h_1 + h_2}{\frac{h_1}{\overline{\varepsilon_{1OFF}}} + \frac{h_2}{\overline{\varepsilon_{2OFF}}}}$$

$$\varepsilon_{\mathit{reff\_composite\_2}} = \frac{h_1 + h_2}{\frac{h_1}{\overline{\varepsilon_{1ON}}} + \frac{h_2}{\overline{\varepsilon_{2OFF}}}}$$

$$\varepsilon_{\mathit{reff\_composite\_3}} = \frac{h_1 + h_2}{\frac{h_1}{\overline{\varepsilon_{1OFF}}} + \frac{h_2}{\overline{\varepsilon_{2ON}}}}$$

$$\varepsilon_{\mathit{reff\_composite\_4}} = \frac{h_1 + h_2}{\frac{h_1}{\overline{\varepsilon_{1ON}}} + \frac{h_2}{\overline{\varepsilon_{2ON}}}}$$

Depending on the number k of stacked layers, a number of combinations of achievable composite dielectric states is $2^k$. In an example of k=4 layers, the number of combinations of achievable composite dielectric states is 16.

Different and tuneable profiles of the dielectric permittivity enable the realization of different $\tilde{G}(x, y)$.

In the next section, choices of materials for this purpose and the possibility of digitizing the dielectric permittivity function as a function of the z-coordinate are elaborated. In order for the device 100 to be programmable, the following compositions of materials that allow dielectric tuneability will be considered:

A plurality of layers in the switchable element 102 may have the same composition and/or the same height. The height is for example 10 nm. The number of possible states in the direction perpendicular to the plane for a number k of stacked computing layers 114 having switchable elements 102 of the same composition and height is k+1.

The layers of different individual switchable elements 102 may have different composition and/or heights. This increases the number of possible states as compared to the case of identical composition and/or heights. A variety of different dielectric states is achievable. The stacking behaves as a weighted binary system where the weight of a bit is controlled by the unit cell height and/or composition.

Depending on the accuracy of a mathematical function to be computed, one may stack many layers with many individual unit cells.

Assuming identical composition and identical height, e.g. h 10 nm, of the layers of the switchable elements 102 and assuming that the permittivity is switchable between $\varepsilon_{off}=3.9$ and $\varepsilon_{on}=10$, for two stacked computing layers 114, the following three dielectric states are available for coding:
  00: 3.9
  01: 5.61
  10: 5.61
  11: 10

If the heights of the layers are non-identical, the number of possible dielectric states increases. Assuming that h1=2.5 nm and h2=7.5 nm, the following four dielectric states are available for coding:
  00: 3.9
  01: 4.6
  10: 7.19
  11: 10

These results indicate that the digitization method described is dependent on the heights of the individual layers and that variety of different dielectric states are achievable. The stacking, effectively behaves as a weighted binary system, where the weight of a bit is controlled by the unit cell height. Depending on the accuracy of the mathematical functions, one may have a stack of many layers, with many individual unit cells.

For example, for the first order differentiation in the y-direction, the spatial impulse response is:

$$\tilde{G}(x, y) = \frac{(i*y)}{\frac{W}{2}}$$

Corresponding to the following dielectric permittivity profile:

$$\varepsilon_r(y) = \frac{1}{jk_0\Delta}\ln\left(j\frac{2y}{W}\right)$$

To achieve a monotonic function for $\varepsilon_r(\gamma)$ an infinite number of individual unit cells would be required. However, for practical purposes, such precision is not required. From the knowledge obtained from electromagnetic simulators, the number of unit cells per wavelength is dependent on the desired accuracy of the mathematical functions and it is considered good practice to have, for example, up to 10 unit cells per wavelength.

In order to simplify the procedure, the following flow-points are for example considered when designing the metasurface:

1. Type of mathematical manipulation to be performed, e.g. integration, differentiation, convolution 2. Equate the spatial impulse response to its desired Fourier pair. By way of example, the equations for differentiation and integration for the y-axis are provided below.

a. Differentiation:

$$\tilde{G}(y) = \frac{(i*y)}{\left(\frac{W}{2}\right)^n}$$

b. Integration:

$$\tilde{G}(y) = \left(\frac{d}{j*y}\right)^n$$

3. Wave propagation through reflection-less media can be written as: $t=e^{jk\Delta}$, where $k=k_0\Delta\varepsilon_r(\gamma)$.

4. Equate the spatial impulse response to its desired Fourier pair. For the y-axis example, $t=\tilde{G}(\gamma)$, e.g. 2.a:

$$t = \frac{(i*y)}{\left(\frac{W}{2}\right)^n}$$

or 2.b:

$$t = \left(\frac{d}{j*y}\right)^n$$

and solve the obtained equation for $\varepsilon_r(\gamma)$.

5. Realize $\varepsilon_r(\gamma)$ by determining the state of the switchable elements 102 of the individual unit cells of the computing layer 114 or the plurality of computing layers 114-1, . . . , 114-k as described above.

Figure 6:
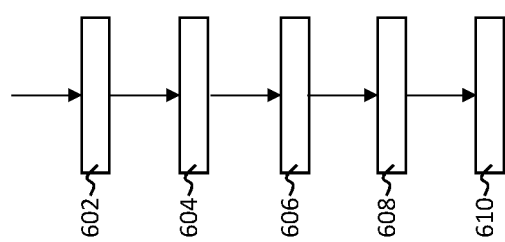

FIG. 6 depicts aspects of a method of operating the device for analogue and programmable computing operating on electromagnetic waves having the frequency. The switchable elements 102 are configured to be switched from having the first dielectric permittivity for electromagnetic waves having the frequency to the second dielectric permittivity for electromagnetic waves having the frequency.

After the start, the method comprises a step 602.

In step 602, a size of the metasurface is provided. The size in the example specifies the amount of switchable element 102 in a rectangular metasurface shape, wherein N provides the number of switchable element 102 in x-axis direction and M provides the number of switchable element 102 in y-axis direction for a N*M sized metasurface.

In the step 602, an amount k of computing layers 114 may be provided for a multilayer setup. For a single layer setup, the amount k=1 is provided.

In the step 602, a permittivity range for a plurality of the k layers is provided. In the example, for a plurality layer k, the value of $\varepsilon_{on}$ and $\varepsilon_{off}$ is provided. In the example the value may be provided depending on the desired mathematical operation.

The first dielectric permittivity and the second dielectric permittivity of the individual switchable elements 102 is determined.

Afterwards, a step 604 is executed.

In the step 604, the $\varepsilon_{reff\_composite}$ values for all the possible states are calculated. These values are in the example computed for the layer or for all layers as described above.

Afterwards a step 606 is executed.

The step 606 comprises equating the spatial impulse response to its desired Fourier pair t=$\tilde{G}$(x, y).

The information about the computing operation is in the example the state space representation of the mathematical operation that shall be computed. In one example, the computing operation is defined depending on the Fourier transform of the function representing the mathematical operation.

Afterwards a step 608 is executed.

The step 608 comprises solving the equation to determine $\varepsilon_r=\varepsilon_r(x, y)$ by determining the state of the switchable elements 102 of the individual unit cells of the computing layer 114 or the plurality of computing layers 114-1, . . . , 114-k.

In one example, the computing layer 114 comprising the plurality of the switchable elements is arranged as single plane array forming the metasurface for computing the mathematical operation. Assuming a plurality of layers in the switchable element 102 is provided having the same composition and the same height, the state space representation directly defines a computer with a 1-bit resolution. The state space representation, in particular the Fourier transform, of the mathematical operation defines the individual states of the state space representation. The state space representation in this case defines the dielectric permittivity of individual switchable elements 102 in the plane array.

When a plurality of the computing layers 114 is stacked in a direction perpendicular to the plane array, the state space representation represents a computer with a k-bit resolution corresponding to the number k of stacked layers in the direction perpendicular to the plane array.

Afterwards a step 610 is executed.

The step 610 comprises programming the computer metasurface (x,y) according to the $\varepsilon_r$ by selecting the states combinations resulting in in a value closest to $\varepsilon_{reff\_composite}$.

In step 610, a plurality of the switchable elements 102 is configured individually in accordance with the computing operation.

This means that individual switchable elements 102 that can be switched from having the first dielectric permittivity for electromagnetic waves having the frequency to the second dielectric permittivity for electromagnetic waves having the frequency are switched to the first dielectric permittivity or the second dielectric permittivity. Thus, the first dielectric permittivity or the second dielectric permittivity is selected.

Depending on the type of switchable elements 102 used, the dielectric permittivity is switched as follows:

When the switchable element 102 is provided with the first layer 108 of dielectric material and the second layer 110 of dielectric material and the switching layer 112 between the first layer 108 and the second layer 110, the switching layer 110 is switched between a non-conductive state and a conductive state.

When the switchable element 102 is provided with a liquid crystal layer or a ferroelectrics layer having a dielectric permittivity birefringence in a range this layer is tuned by a tuning voltage in the range.

When the switchable element 102 is provided with an electro-chromic layer having a dielectric permittivity in a range, this layer is tuned by a tuning voltage in the range.

In a k-bit resolution, one switchable element 102 defines one unit cell. The method may comprise additional weighting of the individual unit cells when the layers of different individual switchable elements 102 have different composition or heights. This allows more different states to be programmed using the same amount of unit cells than when using only identical switching elements 102.

Various actions in the steps of the method described above may be performed simultaneously or at different times.

According to a second aspect, the device 100 comprises a switchable element 102 that is adapted to be switched individually in accordance with the manipulation. In general, the switchable element 102 is adapted to be switched in response to an activation signal.

The switchable element 102 is configured to be switched from having a first dielectric permittivity for electromagnetic waves having the frequency to having a second dielectric permittivity for electromagnetic waves having the frequency.

In FIG. 1, a Cartesian coordinate system is depicted. A plane electromagnetic wave 104 propagating in a negative z-axis direction is linearly polarized along an x-axis and a y-axis. The electromagnetic wave 104 is propagating in the negative z-axis direction and impinges on a surface 106 of the device 100. The surface 106 is considered as a metasurface having a predetermined size.

FIG. 7a depicts the switchable element 102 in a non-actuated state. FIG. 7b depicts the exemplary individual switchable element 102 in an actuated state.

The switchable element 102 comprises a first layer 108 of dielectric material and a second layer 110 of dielectric material. The activation signal may be a voltage that is applied between the first layer 108 and the second layer 110.

A switching layer 112 may be disposed between the first layer 108 and the second layer 110. The first layer 108 and of the second layer 110 in this example have the same dielectric permittivity $\varepsilon_1$.

In one aspect, the switching layer 112 is configured to switch between non-actuated, i.e. a non-conductive state, and an actuated state, i.e. a conductive state, in response to the activation signal. For example, the switching layer 112 comprises a transition metal oxide. Then the dielectric characteristics of the transition metal oxide change by a Mott transition, i.e. a transition from dielectrics to conductors.

The switching layer 112 has dielectric permittivity $\varepsilon_2$ in the non-conductive state. In the conductive state, the dielectric permittivity depends on the electrical conductivity $\sigma_2$ and the permeability $\mu_2$ of the material or composition in the switching layer 112.

The dielectric permittivity $\varepsilon_1$ is the same in both states, the non-conductive state and the conductive state.

The equivalent dielectric permittivity of a switchable element 102 having these 3 layers is defined for the non-conductive state as $$\varepsilon_{off} = \frac{2h_1 + h_2}{\frac{2h_1}{\varepsilon_{r1}} + \frac{h_2}{\varepsilon_{r2}}}$$

Where $h_1$ represents the height of a plurality of the first and the second dielectric layers and $h_2$ represents the height of the switchable element's layer, and for the conductive state as $$\varepsilon_{on} = \varepsilon_1 \left[ 1 - \frac{\gamma_m}{h_1 \varepsilon_{r2} k_0^2} \tanh(\gamma_m h_2) \right]$$

where $\varepsilon_{r1} = \varepsilon_1$ for non-conducting dielectric material and $$\varepsilon_{r2} = 1 - j \frac{\sigma_2}{\omega \varepsilon_0}$$

wherein $\varepsilon_0$ denotes the dielectric permittivity of vacuum and $$k_0 = \frac{\omega}{c}$$

is the propagation constant of electromagnetic waves in free space. $\gamma_m$ denotes the propagation constant in metals.

In general an equivalent dielectric permittivity of a switchable element 102 having n layers is defined for the non-conductive state as $$\varepsilon_{off} = \frac{\sum_{i=1}^{n} h_i}{\sum_{i=1}^{n} \frac{h_i}{\varepsilon_{ri}}}$$

For the conductive state, the equivalent dielectric permittivity depends on the dielectric material and the layers.

As an example for the possibility to tune the dielectric characteristics using sub-skin depth conductors, FIGS. 8a and 8b demonstrate the obtainable effective dielectric characteristics. In FIG. 8a, a dielectric constant is depicted in the upper diagram and a loss tangent of a three layer composite material is depicted in the lower diagram.

The first layer 108 and second layer 110 can comprise a dielectric. A thickness of the first layer 108 and second layer 110 or of the dielectric can be in a range. The thickness may be in the range between 1 nm and 400 nm. The first layer 108 and second layer 110 or the dielectric may comprise for example silicon dioxide, $SiO_2$, in particular with a permittivity of 3.9 and a thickness of 10 nm.

For the case when the dielectric material is silicon dioxide with a thickness of 10 nm the dielectric permittivity is $\varepsilon_{SiO_2} = 3.9$ and the tan $h(\delta_{SiO_2}) = 0.00005$. Other dielectrics, in particular dielectrics having a higher dielectric permittivity than silicon dioxide, may be used as well. An example of dielectrics that may be used includes ceramics such as zirconia. A aluminium oxide or teflon may be used as well.

FIG. 8a and FIG. 8b depict various configurations when the dielectric material is silicon dioxide and the switching layer 112 comprises the transition metal oxide layer. FIG. 8a depicts configurations in the non-actuated state of the switching layer 112. FIG. 8b depicts configurations in the actuated state of the switching layer 112. The transition metal oxide layer in the example is a tungsten trioxide, $WO_3$, layer. A thickness of the $WO_3$ layer is varied from 100 nm to 400 nm as depicted with the following references in FIGS. 8a and 8b:

802: transition metal oxide layer 100 nm,
804: transition metal oxide layer 200 nm,
806: transition metal oxide layer 300 nm,
808: transition metal oxide layer 400 nm, The thickness of the transition metal oxide layer may be in a range. The range may be between 1 nm and 400 Nm. The thickness may be between 100 nm and 400 nm, in particular 100 nm, 200 nm, 300 nm, or 400 nm. Other transition metal oxides may be used as well.

The transition metal oxide layer exhibits the Mott transition upon the intercalation of ions, a temperature change or by applying a sufficiently high DC bias voltage. Either way, non-conductive transition metal oxides become conductive.

The controllable difference of the permittivity between the actuated state and the non-actuated state enables dielectric tuneability.

The dielectric permittivity of $WO_3$ in this example is $\varepsilon_{on} = 8.059$ with a $\tan(\delta_{WO_3}) = 0.0269$ in the actuated state. In the actuated state, the transition metal oxide is conductive with $\sigma = 3.3 \times 10^5$ S/m.

This switching layer 112 is a conductor made to switch between the non-conductive state and conductive state thus forming a bi-stable dielectric that is controllable to change the dielectric state upon external actuation.

A phase shifter or an attenuator may comprise the switching layer 112. The frequency dependence of the loss tangent shown in FIG. 3b is explained by the fact that the electrical thickness of the actuated transition metal oxide films increases as a function of frequency, resulting in an increase of loss tangent.

The metal oxide layer may comprise a different transition metal oxide. Another example of a material that exhibit a transition between the non-conductive to conductive state is vanadium dioxide $VO_2$. The switchable element 102 may comprise vanadium dioxide thus forming a bi-stable dielectric made to switch between the non-conductive state and conductive state and under the influence of an external field.

In general, the switching layer 112 may comprise an electrically conductive or semi-conductive material arranged between the first layer 108 and the second layer 110 being tunable by a tuning voltage.

In one aspect the tuning voltage is a DC bias voltage of approximately 20 V is required to actuate a $WO_3$ or $VO_2$ switching layer 112 of a height of 200 nm.

Figure 9:
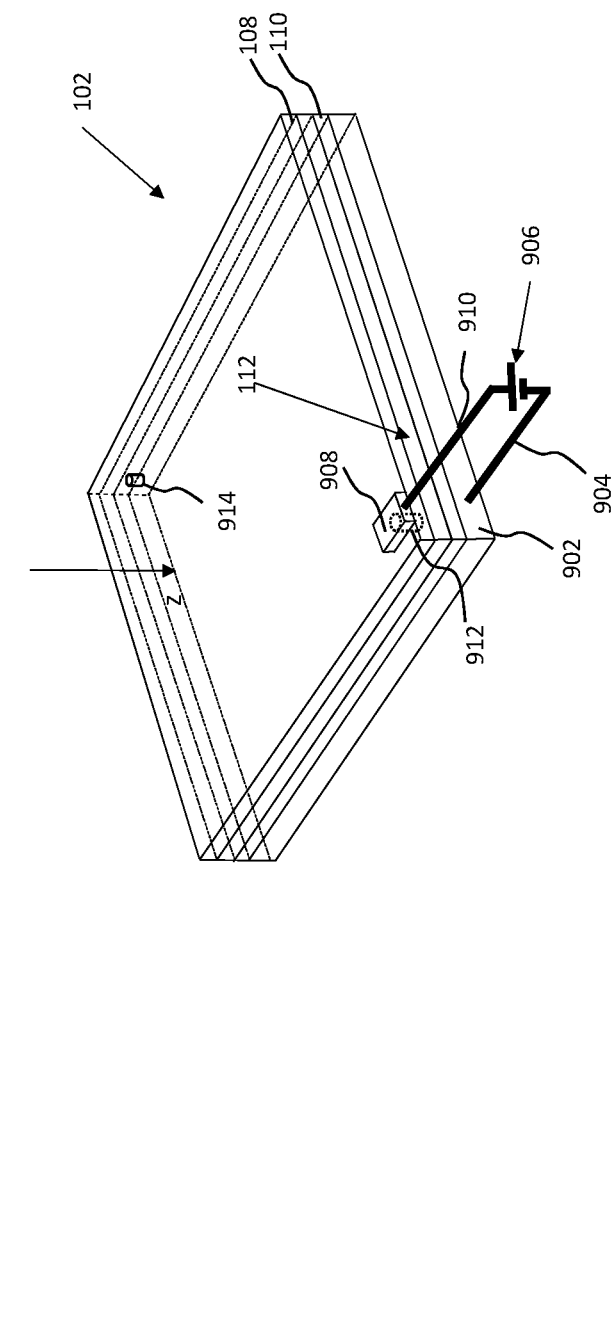

Aspects of a biasing scheme for the switchable element 102 are depicted in FIG. 9. The switchable element 102 is arranged in a plane. The switchable element 102 forms a unit cell that is configurable.

The structure of the unit cells is described below for an exemplary unit cell. The unit cell comprises substrate 902. The substrate 902 may serve as ground for the biasing scheme. To allow the electromagnetic wave to tunnel thru the unit switchable element 102 in z or negative z direction, the substrate 902 or ground layer should preferably be of sub-skin thickness in order to avoid high losses or even shielding. The substrate 902 is connectable by a first line 904 to a voltage source 906. The voltage source 906 is in the example a Direct Current, DC, voltage source. The switching layer 112 of the switchable element 102 may be disposed between a patch 908 and the substrate 902. The patch 908 is connectable to the voltage source 906 by a second line 910.

In order to avoid unwanted losses or modulation, the second line 910, i.e. DC feed line, may comprise a RF blocking (not shown in FIG. 9). In one aspect, the switchable element 102 may support modulation based on a switchable effect of switching layer 112. The second line 910, i.e. the DC feed line, may block RF signals except the modulation frequency bandwidth to be applied by a controlled voltage source 906 modulation applied to the electromagnetic wave tunneling thru the switching element 102.

A first connector 912 connects the patch 908 and the switchable element 112. A second connector 914 connects the switchable element 112 and the substrate 902. The first connector 912 may be in a through hole or via in the first layer 108 of dielectric material. The switchable element 112 is connectable to the voltage source 906 by the first connector 912. The switching layer 112 is connectable to ground by the second connector 914. The first connector 912 may be in a through hole or via in the first layer 108 of dielectric material. The second connector 914 may be in a through hole or via in the second layer 110 of dielectric material. Thus, the switchable element 102 is switchable by tuning a voltage in the aforementioned range between the patch 908 and the substrate 902. The switching layer 112 in on aspect is disposed between the first layer 108 of dielectric material and the second layer 110 of dielectric material. The switching layer 112 in on aspect may comprise the aforementioned transition metal oxide.

In the non-actuated state, the dielectric permittivity is not a direct function of frequency. However, a frequency response is innately included through a frequency dependence of the dielectric parameters of the individual dielectric layers. This is true up to a frequency range when a thickness of the dielectric layers becomes comparable to the corresponding wavelengths of the incident electromagnetic wave. Nevertheless, the situation changes for the actuated state. Assuming that the losses in the first layer 108 of dielectric material and the second layer 110 of dielectric material are below a threshold, the dielectric permittivity in the conductive state is $$\varepsilon_{on} = \varepsilon_1 \left[ 1 + \frac{h_2}{2h_1} \right]$$

This means that an increase in an effective dielectric permittivity is directly proportional to a ratio of the heights of the transition metal oxide and the composite height of the first layer 108 of dielectric material and the second layer 110 of dielectric material. In the example, the losses are low when $\tan h(\delta_{SiO_2})<0.001$. This means that an increase in an effective dielectric permittivity is independent of the conductivity in the actuated state.

Characteristics of a composite dielectric are determined by a ratio of the total layer thicknesses resulting from a number of dielectric layers and a number of conductors respectively.

Figure 10:
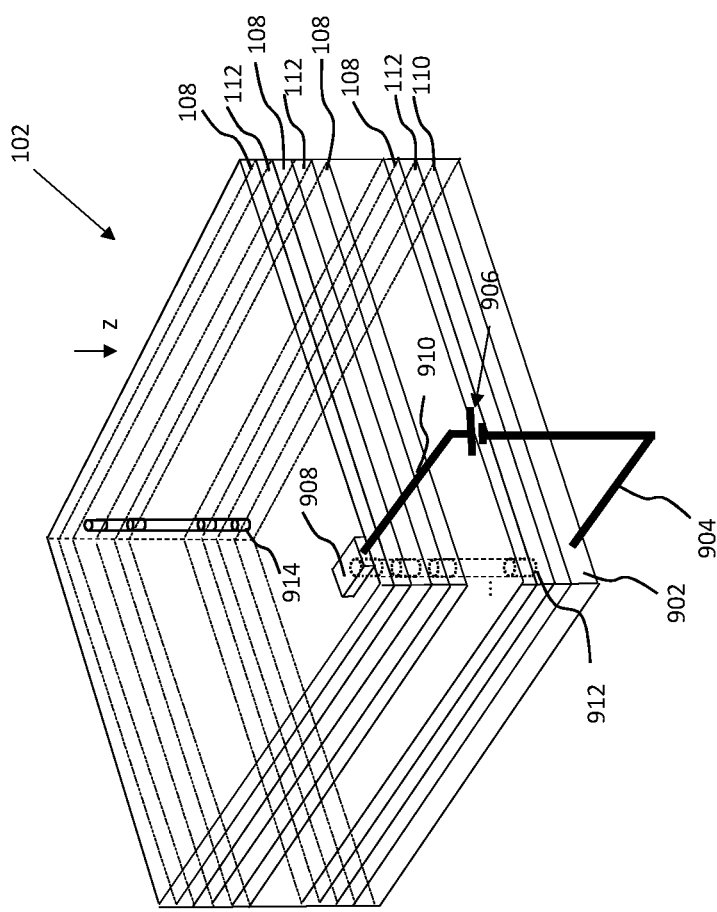

FIG. 10 depicts a scenario for interlacing thin dielectric layers and transition metal oxide layers to form composite dielectric e.g. as a microstrip line.

As depicted in FIG. 10, a plurality of dielectric layers are stacked. At least one first layer 108 of dielectric material may be disposed between a pair of switchable layers 112. At least one second layer 110 of dielectric material may be disposed between a pair of switchable layers 112. In the example depicted in FIG. 10, a plurality of first layers 108 of dielectric material are disposed between the switchable layers 102.

A plurality of switchable layers 112 in the switchable element 102 may have the same height or different heights. A plurality of first layers 108 of dielectric material may have the same height or different heights. A plurality of second layers 108 of dielectric material may have the same height or different heights. A switchable layer 112, a first layer 108 of dielectric material and/or a second layer 110 of dielectric material may have the same height or different heights.

As depicted in FIG. 8b a loss tangent increases with the thickness of the transition metal oxide. A thickness of the transition metal oxide may be varied to achieve a desired dielectric permittivity. The thickness of the transition metal oxide may be varied to achieve a desired loss tangent.

In one aspect, the thickness of the switchable layers 112 is selected to meet a desired loss. In one aspect a number of the switchable layers 112 that is stacked is selected according to a desired dielectric permittivity.

In one aspect, the first contact 912 and the second contact 914 are configured to apply the tuning voltage. In another aspect, the first contact 912 and the second contact 914 are configured to apply a tuning temperature. In this aspect, the switchable element 102 may be configured with a cooling or heating element. The cooling element or the heating element may be disposed at or instead of the substrate 902. The cooling element or the heating element may be disposed at or instead of the patch 908.

As previously indicated, a tuning voltage or a tuning temperature can be either used for quasi-static control of the dielectric permittivity, or it can be used to apply a modulation to the RF wave tunneling thru the switching layer 102. Depending on the respective application, the control voltage lines either are designed to block RF frequencies in order to avoid losses or unwanted modulation, or in case of applied modulation, the DC feed blocks the RF except the wanted modulation bandwidth.

The first layer 108 or the second layer 110 or even both could be realized using EC material, which would allow for further tuning—e.g. coarse tuning by the switchable layer 112 and fine tuning of dielectric permittivity by the controllable EC based first layer 108 and/or second layer 110. In this aspect, the first layer 108 and/or the second layer 110 may also have independent DC biasing with electrodes in sub-skin depth in order to allow for individual tuning of the dielectric permittivity.

The invention claimed is:

1. A switchable element, comprising:
a switchable layer configured to, in response to an activation signal, switch from having a first dielectric permittivity for electromagnetic waves having a frequency to having a second dielectric permittivity for the electromagnetic waves having the frequency.

2. The switchable element according to claim 1, wherein the switchable layer comprises a liquid crystal layer or a ferroelectrics layer having a variable dielectric permittivity birefringence which is tunable by a tuning voltage.

3. The switchable element according to claim 1, wherein the switchable layer comprises an electro-chromic layer having a variable dielectric permittivity which is tunable by a tuning voltage in the range.

4. The switchable element according to claim 1, wherein the switchable element comprises the switchable layer and at least one layer of dielectric material, wherein the switchable layer is configured to having the first dielectric permittivity in a conductive state of the switchable layer, and to having the second dielectric permittivity in a non-conductive state of the switchable layer, wherein the switchable element comprises at least one contact configured to having contact with the switchable layer.

5. The switchable element according to claim 4, wherein the at least one layer of dielectric material is configured with a via, wherein the at least one contact is disposed in the via.

6. The switchable element according to claim 5, wherein a patch is disposed on the at least one layer of dielectric material, wherein the patch is configured to contact at least one contact.

7. The switchable element according to claim 4, wherein the switchable element comprises a transition metal oxide.

8. The switchable element according to claim 4, comprising at least one of a plurality of the switchable layers and a plurality of the layers of dielectric material.

9. The switchable element according to claim 8, wherein the at least one contact is configured to having contact with the plurality of switchable layers.

10. The switchable element according to claim 9, wherein at least one of the switchable layers and at least one of the layers of dielectric material are alternately stacked.

11. The switchable element according to claim 8, wherein at least one of the switchable layers and at least one of the layers of dielectric material are alternately stacked.

12. The switchable element according to claim 8, wherein the plurality of the layers of dielectric material is configured with at least one via, wherein the at least one contact is disposed in the at least one via.

13. The switchable element according to claim 12, wherein at least one of the switchable layers and at least one of the layers of dielectric material are alternately stacked.

14. The switchable element according to claim 8, wherein the at least one contact is configured to apply a tuning voltage or a tuning temperature to at least one of the switchable layers.

15. A device, comprising:
a switchable element configured to, in response to an activation signal, switch from having a first dielectric permittivity for electromagnetic waves having a frequency to having a second dielectric permittivity for electromagnetic waves having the frequency, the device for analogue and programmable computing operating on electromagnetic waves having a frequency, comprising a plurality of the switchable elements that are adapted to be switched individually in accordance with the computing operation.

16. The device according to claim 15, wherein a computing layer comprises the plurality of the switchable elements arranged in a plane array.

17. The device according to claim 16, wherein a plurality of the computing layers are stacked in a direction perpendicular to the plane.

18. The device according to claim 15, wherein the first dielectric permittivity corresponds to a conductive state associated with a first value of a binary bit and the second dielectric permittivity corresponds to a non-conductive state associated with a second value of the binary bit, different from the first value.

* * * * *